United States Patent
Watanabe et al.

(10) Patent No.: US 9,391,190 B2
(45) Date of Patent: Jul. 12, 2016

(54) FIELD EFFECT TRANSISTOR INCORPORATING A SCHOTTKY DIODE

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Yukihiko Watanabe, Nagakute (JP); Sachiko Aoi, Nagakute (JP); Hidefumi Takaya, Toyota (JP); Atsuya Akiba, Kariya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 14/299,922

(22) Filed: Jun. 9, 2014

(65) Prior Publication Data
US 2015/0021680 A1    Jan. 22, 2015

(30) Foreign Application Priority Data
Jul. 18, 2013  (JP) ................ 2013-149323

(51) Int. Cl.
| | | |
|---|---|---|
| H01L 29/78 | (2006.01) | |
| H01L 29/872 | (2006.01) | |
| H01L 29/66 | (2006.01) | |
| H01L 27/02 | (2006.01) | |
| H01L 21/04 | (2006.01) | |
| H01L 29/16 | (2006.01) | |

(52) U.S. Cl.
CPC .......... *H01L 29/7806* (2013.01); *H01L 21/049* (2013.01); *H01L 21/0495* (2013.01); *H01L 27/0255* (2013.01); *H01L 29/66068* (2013.01); *H01L 29/66734* (2013.01); *H01L 29/872* (2013.01); *H01L 29/1608* (2013.01); *H01L 29/7813* (2013.01)

(58) Field of Classification Search
CPC .............. H01L 29/7806; H01L 21/049; H01L 21/0495; H01L 27/0255; H01L 29/1608; H01L 29/66068; H01L 29/66734; H01L 29/872; H01L 29/7813
See application file for complete search history.

(56) References Cited

U.S. PATENT DOCUMENTS

| | | | |
|---|---|---|---|
| 5,614,749 A | 3/1997 | Ueno | |
| 5,693,569 A | 12/1997 | Ueno | |
| 6,841,836 B2 * | 1/2005 | Saggio | ............... H01L 29/0634 257/155 |
| 7,154,145 B2 * | 12/2006 | Takahashi | ........... H01L 29/0696 257/288 |

FOREIGN PATENT DOCUMENTS

JP    A-8-204179    8/1996

* cited by examiner

*Primary Examiner* — Eric Ward
(74) *Attorney, Agent, or Firm* — Oliff PLC (57) ABSTRACT

A FET incorporating a Schottky diode has a structure allowing the ratio of an area in which the Schottky diode is formed and an area in which the FET is formed to be freely adjusted. A trench extending for a long distance is utilized. Schottky electrodes are interposed at positions appearing intermittently in the longitudinal direction of the trench. By taking advantage of the growth rate of a thermal oxide film formed on SiC being slower, and the growth rate of a thermal oxide film formed on polysilicon being faster, a structure can be obtained in which insulating film is formed between gate electrodes and Schottky electrodes, between the gate electrodes and a source region, between the gate electrodes and a body region, and between the gate electrodes and a drain region, and in which insulating film is not formed between the Schottky electrodes and the drain region.

2 Claims, 9 Drawing Sheets

FIELD EFFECT TRANSISTOR INCORPORATING A SCHOTTKY DIODE

TECHNICAL FIELD

In the present specification, a FET (Field Effect Transistor) is disclosed in which switching is performed by a gate electrode, and which incorporates a Schottky diode.

DESCRIPTION OF RELATED ART

A FET incorporating a diode for preventing damage to the FET when high voltage is applied, or a FET incorporating a diode operating as a free-wheeling diode is known, and an example thereof is described in Patent Document 1.

In the technique of Patent Document 1, a trench is formed on both sides of a gate electrode extending linially, and a Schottky electrode is formed on a side surface and bottom surface of the trench. A Schottky diode is formed by an interface of the Schottky electrode and a drain region defining the side surface and bottom surface of the trench.

PRIOR ART

Patent Document

[Patent Document 1] Japanese Patent Application Publication No. 1996-204179.

SUMMARY OF THE INVENTION

Technical Problem

In the technique of Patent Document 1, a gate electrode of a FET extending in a straight line, and a Schottky electrode of a Schottky diode extending parallel to the gate electrode, are disposed alternately. In this layout, it is difficult to adjust the area ratio of the range operating as the FET and the range operating as the diode, and it occurs, for example, that the diode is formed in an unnecessarily large area.

In the present specification, a technique is disclosed which allows the area ratio of the range operating as the FET and the range operating as the diode to be freely adjusted.

Solution to the Technical Problem

A semiconductor device disclosed in the present specification comprises a source region formed in a position facing a surface of a semiconductor substrate, a body region disposed at a deep side of the source region, and a drain region disposed at a deep side of the body region. A trench is formed passing from the surface of the semiconductor substrate through the source region and the body region and reaching the drain region, the trench extending linearly along the surface of the semiconductor substrate.

Gate electrodes and Schottky electrodes are filled alternately within the trench when viewed along the length of the trench. Insulating film is formed between each of the gate electrodes and the Schottky electrodes, the gate electrodes and the source region; the gate electrodes and the body region, and the gate electrodes and the drain region. In contrast, insulating film is not formed between the Schottky electrodes and the drain region. Insulating film may be formed or may not be formed between the Schottky electrodes and the source region, and between the Schottky electrodes and the body region.

In the above semiconductor device, a FET is formed by the source region, the body region, the drain region, the gate electrodes, the insulating film, etc., and a Schottky diode is formed by the interface of the Schottky electrodes and the drain region. Because the gate electrodes and Schottky electrodes are disposed alternately in the longitudinal direction of the trench, a semiconductor device is formed in which the FETs and the Schottky diodes are formed alternately in the longitudinal direction of the trench. In case of this layout, it is possible to freely set the length of the gate electrodes as measured along the longitudinal direction of the trench, and the length of the Schottky electrodes as measured along the longitudinal direction of the trench. Consequently, it becomes possible to freely adjust the area ratio of the range operating as the FET and the range operating as the diode. Further, it becomes possible to homogeneously mix the range operating as the FET and the range operating as the diode within the semiconductor substrate. Compared to the case where the range operating as the FET and the range operating as the diode are unevenly distributed, the distribution of current density within the semiconductor substrate is homogenized when the FET range and diode range are distributed homogeneously, and the occurrence of local current concentration can be prevented. Further, the effect of increasing the breakdown voltage of the FET by using a diode can he obtained homogeneously without depending on location within the semiconductor substrate.

The semiconductor device described above can be manufactured by the following method. The manufacturing method comprises forming a laminated structure of a source region, a body region, and a drain region within a semiconductor substrate having a base material SiC, forming a trench from a surface of the semiconductor substrate through the source region and the body region and reaching the drain region and extending linearly along the surface of the semiconductor substrate, forming a first thermal oxide film on a wall surface of the trench, filling polysilicon into the trench having the first thermal oxide film formed on the wall surface, removing the polysilicon and the first thermal oxide film to form holes at positions appearing intermittently when viewed along the length of the trench, forming a second thermal oxide film on a wall surface of the holes, etching the second thermal oxide film, and filling a Schottky electrode in each of the holes.

Since the growth rate of the thermal oxide film is different on SiC and polysilicon, when forming the second thermal oxide film, a thin second thermal oxide film is formed on an SiC wall surface, and a thick second thermal oxide film is formed on a polysilicon wall surface. Therefore, when etching the second thermal oxide film, it is possible to end the etching in a state where the thin second thermal oxide film formed on the SiC wall surface has been removed, and the thick second thermal oxide film formed on the polysilicon wall surface is remaining. By the above method, a structure can be manufactured in which the gate electrodes and the Schottky electrodes are filled alternately when viewed along the length of the trench, an insulating film is formed between each of the gate electrodes and the Schottky electrodes, the gate electrodes and the source region, the gate electrodes and the body region, and the gate electrodes and the drain region, and in which an insulating film is not formed between the Schottky electrodes and the drain region. In the present specification, thermal oxide film is referred to in the case of a description relating to the manufacturing method. Since the thermal oxide film is insulating, it is referred to as insulating film when the manufactured product is described.

Details and further improvements to the technique disclosed in the present specification are described in the "Feature of Embodiment" and "Embodiments" below.

BRIEF DESCRIPTION OF THE DRAWINGS

FIG. 3 (A) is a cross-sectional view of a line A-A of FIG. 2, FIG. 3 (B) is a cross-sectional view of a line B-B of FIG. 2. (A) and (B) in FIGS. 4-9 indicate the same.

FEATURE OF THE EMBODIMENTS

Figure 1:
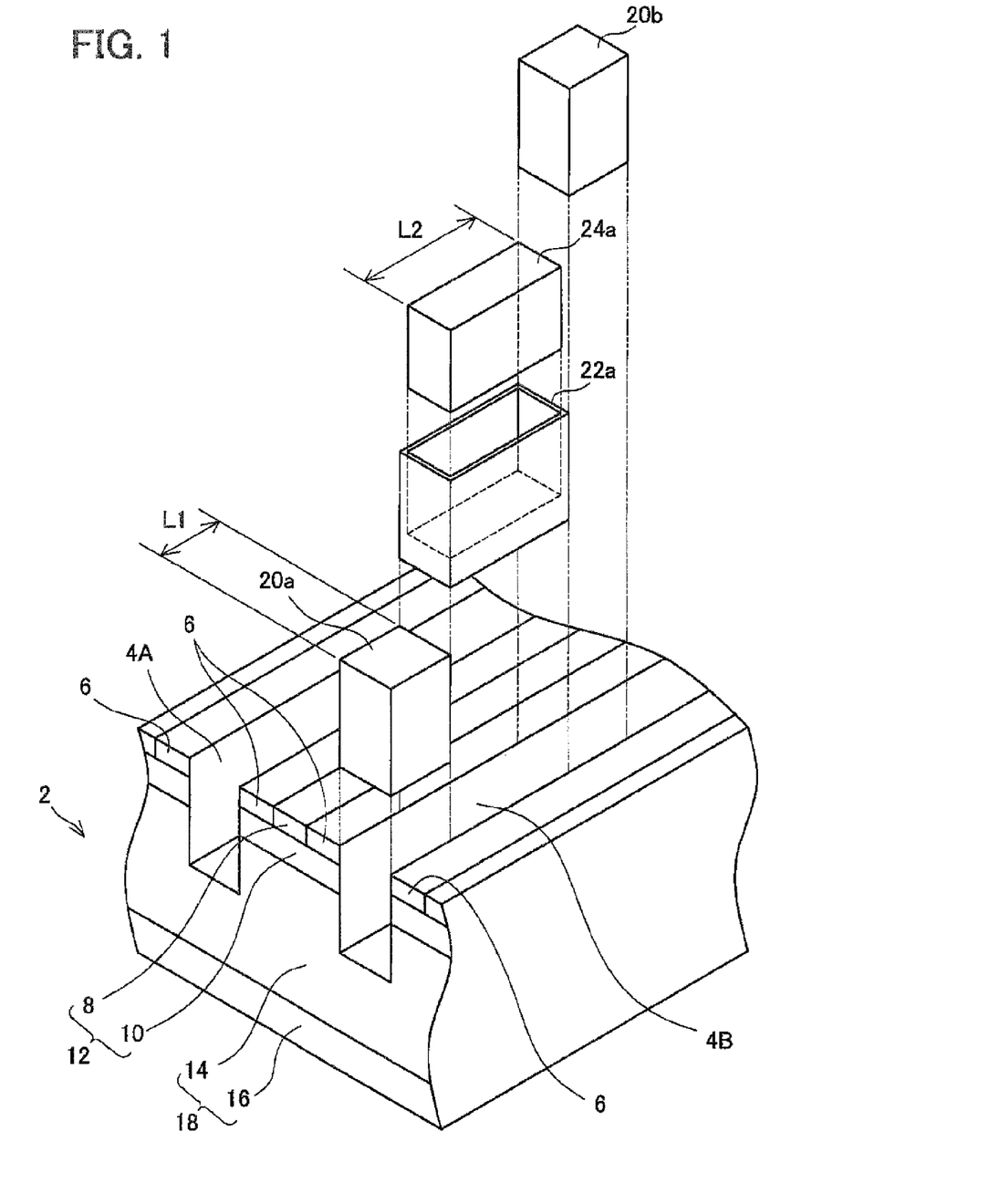
FIG. 1 shows a perspective view of a semiconductor device of a first embodiment. However, Schottky electrodes, a gate electrode and an insulating film surrounding the gate electrode are shown in a state of having been removed from a trench.

Features of the embodiments described below will be noted.
(Feature 1) The drain region comprises a low impurity concentration region positioned at the side of the body region, and a high impurity concentration region in ohmic contact with the drain electrode.
(Feature 2) The body region comprises a high impurity concentration region formed at a position facing the surface of the semiconductor substrate, and in ohmic contact with the source electrode, and a low impurity concentration region formed at a position facing the gate electrode via the insulating film, and forming an inversion layer when a voltage is applied to the gate electrode.
(Feature 3) Impurities of an opposite conductivity type to the drain region are doped at a position facing the bottom surface of the trench.
Embodiments FIG. 1 schematically shows the semiconductor structure of a FET incorporating a Schottky diode of a first embodiment. Reference number 2 is a semiconductor substrate which is formed of n-type SiC. A plurality of trenches 4 extending in parallel is formed in a surface of the semiconductor substrate 2. In FIG. 1, only two trenches 4A, 4B are shown. In case of describing phenomena which are in common for all the trenches, reference numbers without suffixed letters are used. The same applies to other members, etc. A source region 6 is formed at a position facing the surface of the semiconductor substrate 2 and in contact with the trench 4. The source region 6 has n-type impurities implanted at a high concentration therein, and is in ohmic contact with a source electrode (not shown: an anode electrode of a Schottky diode) formed on the surface of the semiconductor substrate 2. A body region 10 is formed below the source region 6. The body region 10 has p-type impurities implanted at a low concentration therein, and is in contact with the trench 4. When a positive voltage is applied to a gate electrode 24 (to be described), the body region 10 in a range facing the gate electrode 24 via a gate insulating film 22 is inverted. An n-type impurity low concentration region 14 is formed below the body region 10, and an n-type impurity high concentration region 16 is formed below the low impurity concentration region 14. The low impurity concentration region 14 is a region in which the n-type SiC substrate 2 has not been processed, and is remaining. The high impurity concentration region 16 has n-type impurities implanted at a high concentration therein, and is in ohmic contact with a drain electrode (not shown: a cathode electrode of the Schottky diode) formed at a back surface of the semiconductor substrate 2. The low impurity concentration region 14 may be called a drift region and, in that case, the high impurity concentration region 16 is called a drain region. In the present specification, the n-type impurity low concentration region 14 and the n-type impurity high concentration region 16 are collectively called a drain region 18. A body contact region 8 is formed facing the surface of the semiconductor substrate 2 at a position between a pair of the source regions 6, 6, The body contact region 8 has p-type impurities implanted at a high concentration therein, and is in ohmic contact with the source electrode (not shown) formed at the surface of the semiconductor substrate 2. In the present specification, a p-type impurity low concentration region 10 and a p-type impurity high concentration region 8 are collectively called a body region 12.

Schottky electrodes 20 and gate electrodes 24 are disposed alternately within the trench 4. In FIG. 1, a portion is shown in which the Schottky electrodes 20 and gate electrodes 24 are disposed in the sequence Schottky electrode 20a, gate electrode 24a, Schottky electrode 20b.. In reality, the sequence continues 20a, 24a, 20b, 24b, 20c, 24e. . . . . In describing phenomena in common for the Schottky electrodes 20a, 20b, etc. the suffixed letters are omitted. The same applies for the gate electrodes. In FIG. 1, the electrodes are shown outside the trench but, in practice, the electrodes are housed within the trench 4. The reference number 22 denotes a gate insulating film which covers five surfaces (five surfaces other than the upper surface) of the gate electrode 24. In FIG. 1, a gate insulating film 22a. which covers the gate electrode 24a. is shown. In contrast, the Schottky electrodes 20 are not covered by an insulating film. The gate insulating film 22a. insulates between the gate electrodes 24 and the Schottky electrodes 20, between the gate electrodes 24 and the source region 6, between the gate electrodes 24 and the body region 12, and between the gate electrodes 24 and the drain region 18. In contrast, the Schottky electrodes 20 and the drain region 18 have a relationship of direct contact. An interlayer insulating film (not shown) insulates between the source electrode (not shown in FIG. 1) and the gate electrodes 24. The source electrode, which is not shown, is in ohmic contact with the source region 6, the body region 12, and the Schottky electrodes 20. The source region 6, the body region 12, and the Schottky electrodes 20 have the same voltage, and an insulating film may or may not be formed between the Schottky electrodes 20 and the source region 6, and between the Schottky electrodes 20 and the body region 12. In the present embodiment, an insulating film is not formed.

In the semiconductor device described above, a FET is constituted by the source region 6, the body region 12, the drain region 18, the gate insulating film 22, and the gate electrodes 24. Further, the Schottky diode is formed by the Schottky electrode 20 and the drain region 18. In this case, it is possible to freely adjust a distance L1 of the Schottky electrode 20 in the longitudinal direction of the trench 4, and a distance L2 of the gate electrode 24 in the longitudinal direction of the trench 4. The ratio of the area in which the diode is formed, and the area in which the FET is formed can be freely adjusted.

Further, the arrangement density of the Schottky electrodes 20 can be freely adjusted by adjusting the distance L2. The Schottky electrodes may be arranged at a fine pitch or a coarse pitch. In a case where the Schottky electrodes are arranged at a fine pitch, Schottky electrodes and gate electrodes are disposed alternately for every trench. In a case where the Schottky electrodes are arranged at a coarse pitch, Schottky electrodes and gate electrodes are disposed alternately for each one trench or for a plurality or trenches, and only gate electrodes are disposed in the remaining trenches.

(Second Embodiment)

Figure 2:
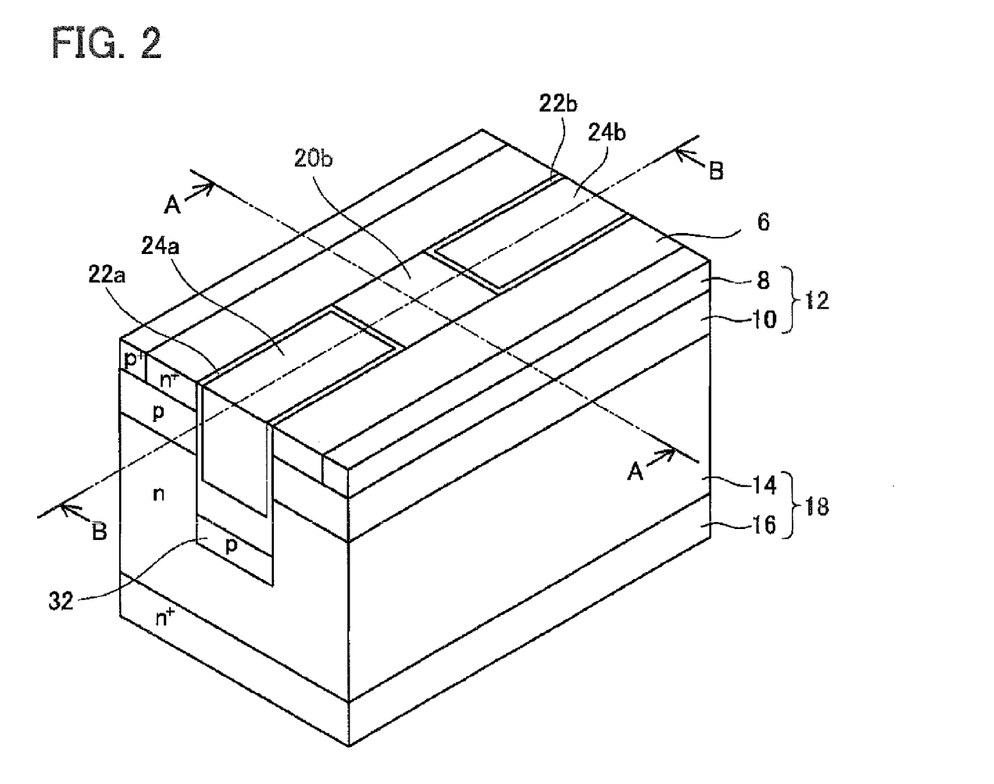
FIG. 2 shows a perspective view of a semiconductor device of a second embodiment.

FIG. 2 shows a perspective view of a semiconductor device of a second embodiment. A state is shown in which the Schottky electrode 20, the gate electrodes 24 and the gate insulating film 22 are housed in the trench 4. In FIG. 2, a state is shown in which the interlayer insulating film, the source electrode and the drain electrode, to be described, have been removed.

Figure 3A:
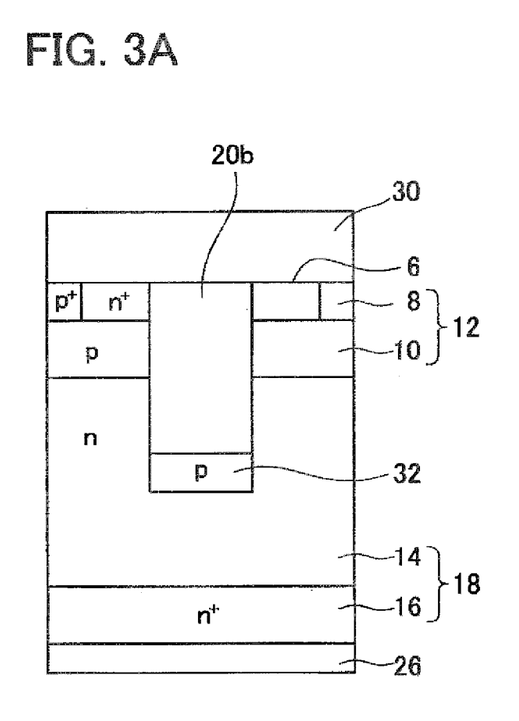
Figure 3B:
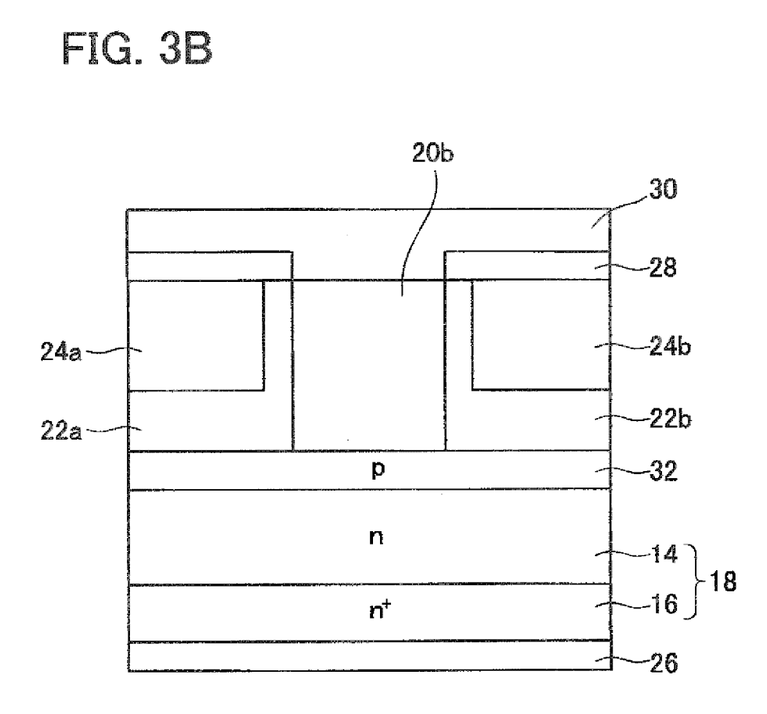

FIG. 3 (A) shows a cross-sectional view of a line A-A of FIG. 2, FIG. 3 (B) shows a cross-sectional view of a line B-B of FIG. 2. In FIG, 3, an interlayer insulating film 28, a source electrode 30, and a drain electrode 26 are shown.

Below, only points differing from the first embodiment are described, and duplicated descriptions are omitted. In the second embodiment, a region 32 into which p-type impurities are diffused is formed in a range facing the bottom surface of the trench 4. The p-type region 32 is effective in increasing voltage when current starts to flow when a reverse bias is applied to the Schottky diode.

The source electrode (an anode electrode of a diode) 30 is formed at the surface of the semiconductor substrate 2. The interlayer insulating film 28 is formed between the source electrode 30 and the gate electrode 24. The source electrode 30 is in ohmic contact with the source region 6, the body region 12, and the Schottky electrode 20, and is insulated from the gate electrode 24. The drain electrode (a cathode electrode of the diode) 26 is formed at a back surface of the semiconductor substrate 2. The drain electrode 26 is in ohmic contact with the drain region 18.

(Manufacturing Method of the Second Embodiment)

The manufacturing method will be described with reference to FIG. 4 onward. (A) of FIGS. 4-9 corresponds to the cross-sectional view of the line A-A of FIG. 2, and (B) corresponds to the cross-sectional view of the line B-B of FIG. 2.

Figure 4A:
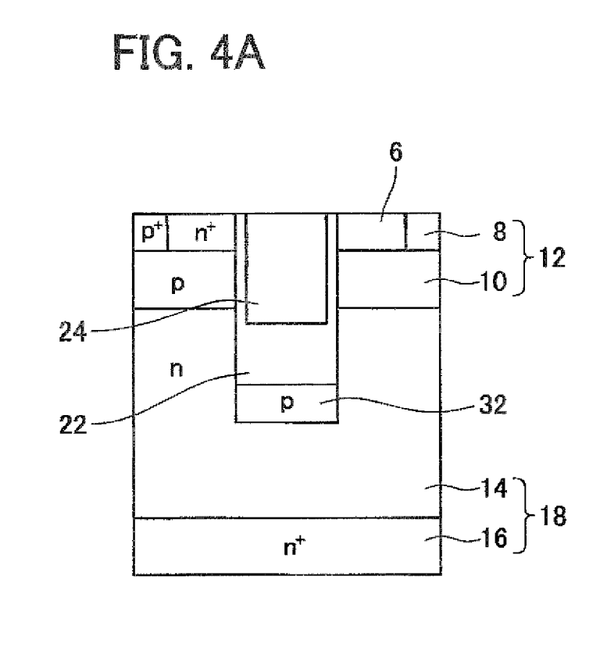
FIGS. 4A and 4B show a cross-sectional view in a first stage of a manufacturing process of the semiconductor device of the second embodiment.
Figure 4B:
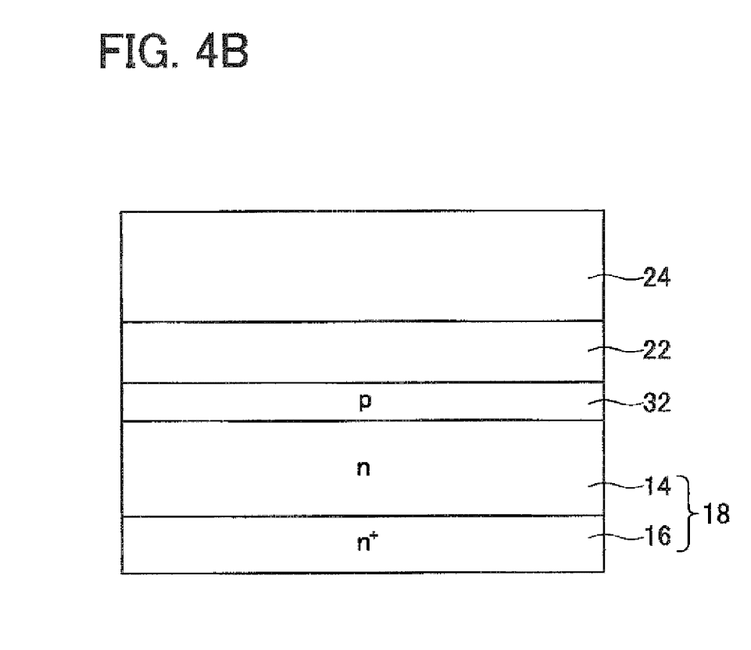

FIG. 4 shows a state in which the gate electrode 24 extends uniformly within the trench 4. At this stage, the structure of the FET is complete. The Schottky electrode has not yet been formed. Before the stage of FIG. 4, the source region 6 and the body regions 8, 10 are formed by implanting impurities from the surface of the semiconductor substrate 2. The high impurity concentration drain region 16 is formed by implanting impurities from the back surface of the semiconductor substrate 2. At that stage, the laminated structure of the source region 6, the body region 12, and the drain region 18 is formed. Next, the trench 4 is formed which passes through the source region 6 and the body region 10 from the surface of the semiconductor substrate 2 and reaches the drain region 14, and which extends linearly along the surface of the semiconductor substrate 2. Next, the p-type impurity region 32 is formed by implanting impurities into the bottom surface of the trench 4. Next, the semiconductor substrate 2 is heat treated, forming a first thermal oxide film on the wall surfaces of the trench 4. The first thermal oxide film referred to here means a thermal oxide film formed a first time. The first thermal oxide film becomes a part of the gate insulating film 22 surrounding the gate electrode 24. Next, polysilicon is filled into the trench 4 having the first thermal oxide film, formed on the wall surfaces. The filled polysilicon forms the gate electrode 24. The structure of FIG. 4 can be obtained through the above stage.

Figure 5A:
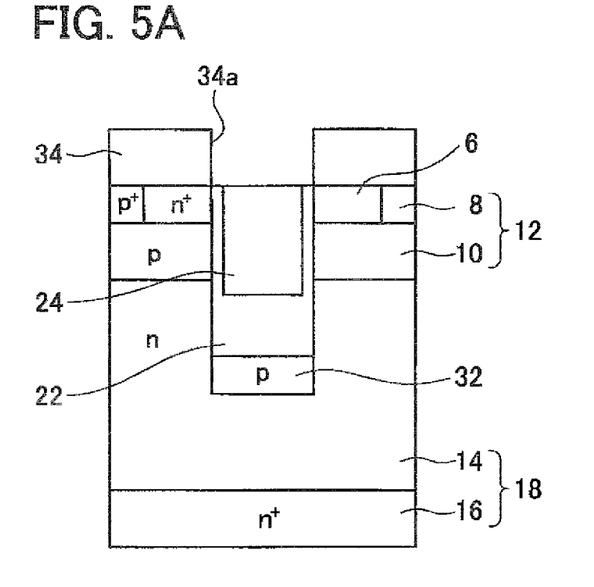
FIGS. 5A and 5B show a cross-sectional view in a second stage of the manufacturing process of the semiconductor device of the second embodiment.
Figure 5B:
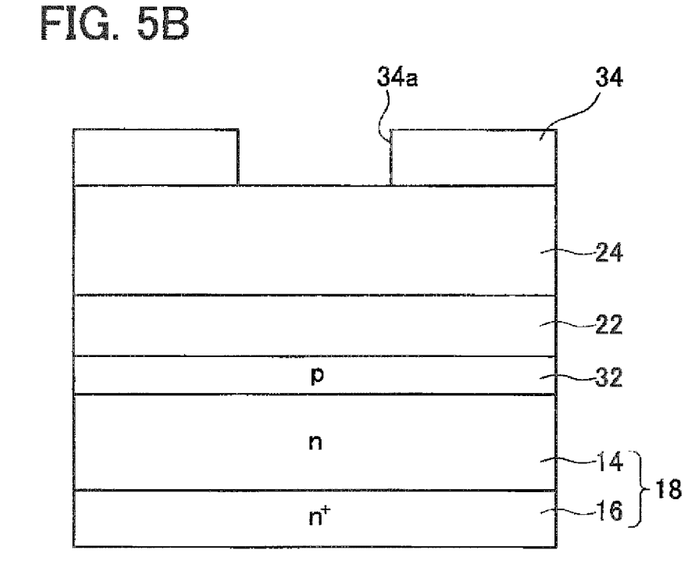

FIG. 5 shows a stage of forming a mask 34 on the surface of the semiconductor substrate 2 in order to regulate the range in which the Schottky electrodes are formed. Openings 34a. are formed in the mask 34. The openings 34a. are formed at positions above the trench 4. Further, openings 34a. are formed at positions appearing intermittently when viewed along the length of the trench 4.

Figure 6A:
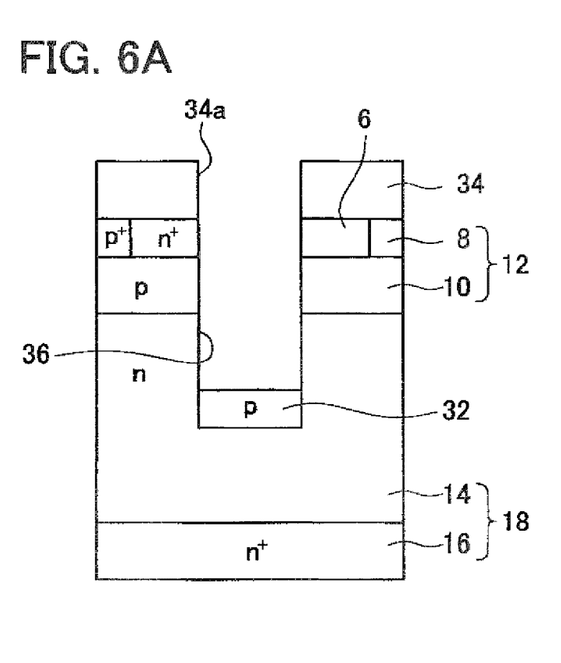
FIGS. 6A and 6B show a cross-sectional view in a third stage of the manufacturing process of the semiconductor device of the second embodiment.
Figure 6B:
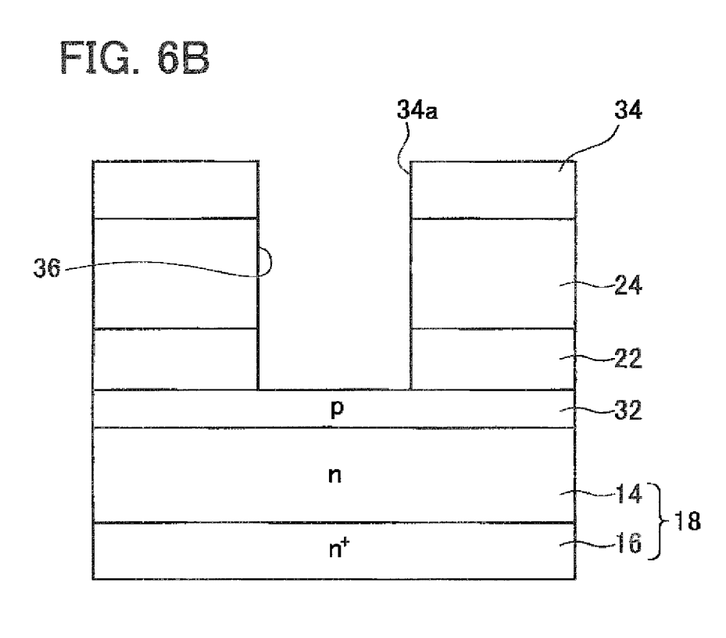

FIG. 6 shows a stage of etching from the openings 34a.. In this etching, a method is used in which polysilicon and silicon oxide are etched, and SiC is not etched. Consequently, holes 36 are formed at the position of the openings 34a.. The region 32 in which p-type impurities are diffused is exposed at a bottom surface of the holes 36, and the source region 6, the body region 10, the drain region 14, the gate electrode 24, and the gate insulating film 22 are exposed at side surfaces of the holes 36.

Next, the mask 34 is removed, and the semiconductor substrate 2 is heat treated, forming a second thermal oxide film on the surface of the semiconductor substrate 2 and the wall surfaces and bottom surface of the holes 36. Second referred to here means formed a second time.

The source region 6 and the body contact region 8 facing the surface of the semiconductor substrate are formed of SiC. The gate electrode 24 facing the surface of the semiconductor substrate is formed of polysilicon. The source region 6, the body region 10, and the drain region 14 facing the wall surfaces of the holes 36, and the p-type region 32 facing the wall surfaces of the holes 36, are formed of SiC. The gate electrode 24 facing the wall surfaces of the holes 36 is formed of polysilicon, and the gate insulating film 22 facing the wall surfaces of the holes 36 is formed of silicon oxide.

Figure 7A:
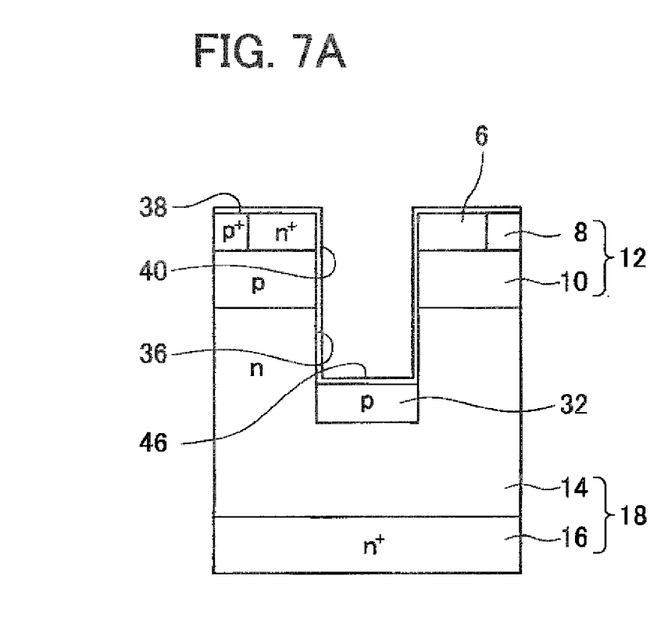
FIGS. 7A and 7B show a cross-sectional view in a fourth stage of the manufacturing process of the semiconductor device of the second embodiment.
Figure 7B:
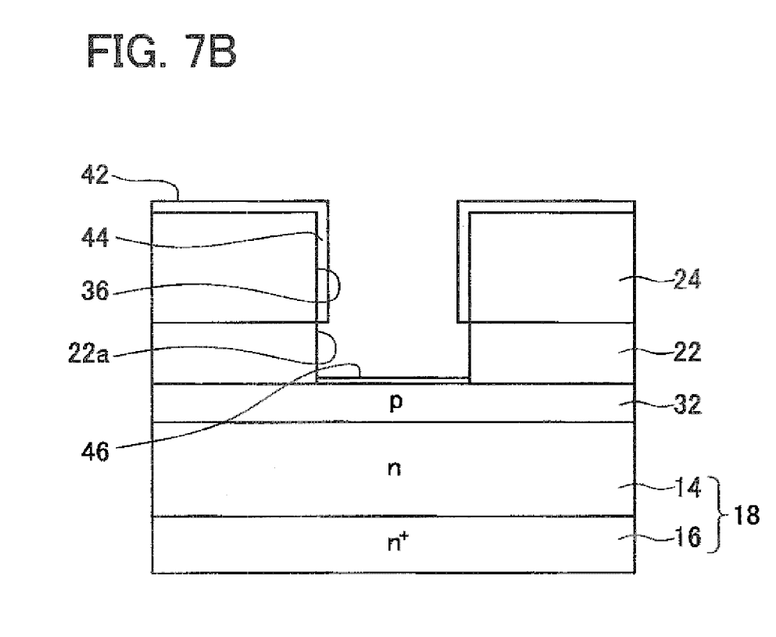

The growth rate of a thermal oxide film grown by heat treatment varies lay material. The growth rate of a thermal oxide film grown on a polysilicon surface >the growth rate of a thermal oxide film grown on an SiC surface. New silicon oxide is not formed on a silicon oxide surface. That is, a thermal oxide film does not grown on a silicon oxide surface. Consequently, as shown in FIG. 7 (A), a thin thermal oxide film 38 is formed on a surface of the source region 6 and the body contact region 8. A thin thermal oxide film 40 is formed on a side surface of the source region 6, a side surface of the body region 10, and a side surface of the drain region 14. Further, as shown in FIG. 7 (A) (B), a thin thermal oxide film 46 is formed on an upper surface of the p-type diffusion region 32. Simultaneously, as shown in FIG. 7 (B), a thick thermal oxide film 42 is formed on an upper surface of the gate electrode 24, and a thick thermal oxide film 44 is formed on a side surface of the gate electrode 24.

Figure 8A:
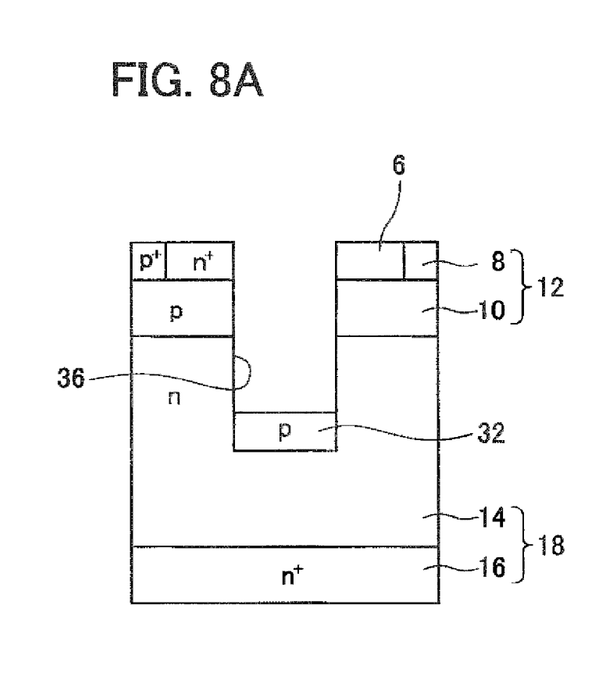
FIGS. 8A and 8B show a cross-sectional view in a fifth stage of the manufacturing process of the semiconductor device of the second embodiment.
Figure 8B:
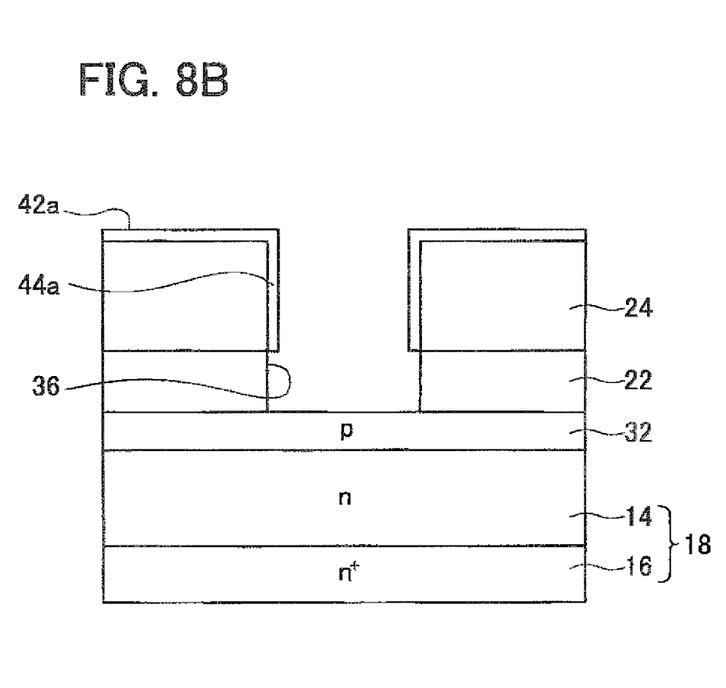
Figure 9A:
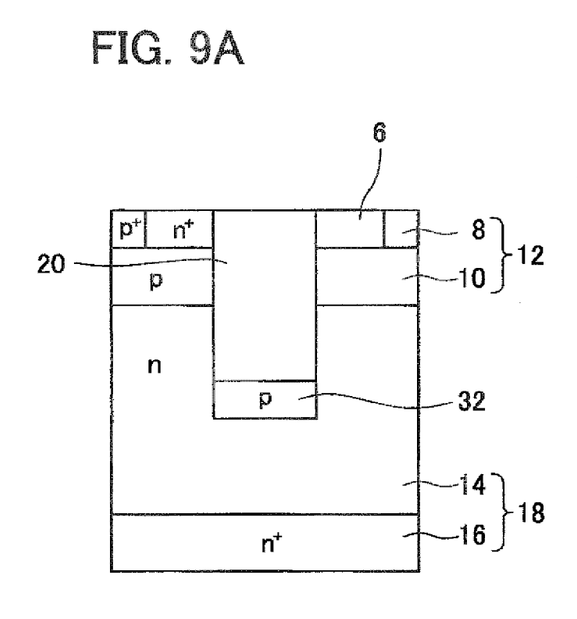
FIGS. 9A and 9B show a cross-sectional view in a sixth stage of the manufacturing process of the semiconductor device of the second embodiment.
Figure 9B:
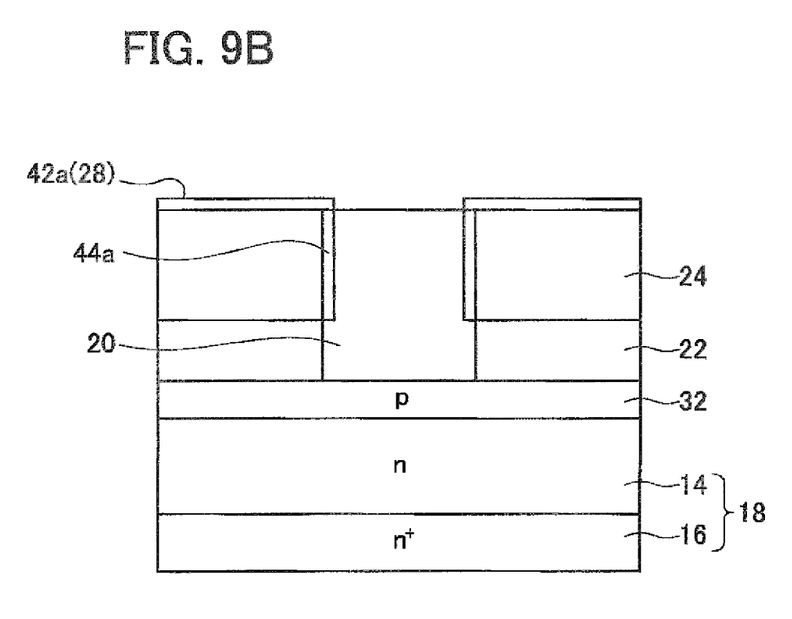

Next, the thermal oxide films are etched. At this juncture, the etching ends at the stage where the thin thermal oxide films 38, 40, 46 shown in FIG. 7 (A), etc. have been eliminated. When the etching ends at that time, a state can be obtained in which the thin thermal oxide films 38, 40, 46 have been eliminated, but the thick thermal oxide films 42, 44 are remaining. In FIG. 8, thermal oxide films whose thickness has decreased, but which still remain, are denoted by reference numbers 42a, 44a.. Then, the Schottky electrode 20 is grown in the hole 36. The thermal oxide film 42a. shown in FIG. 8 becomes the interlayer insulating film 28 shown in FIG. 3 (B), and the thermal oxide film 44*a*. becomes a part of the insulating film 22*a*. which insulates the trench electrode 24 and the Schottky electrode 20.

The FET incorporating a Schottky diode of the second embodiment is manufactured by the manufacturing method described above.

Specific examples of the present invention are described above in detail, but these examples are merely illustrative and place no limitation on the scope of the patent claims. The technology described in the patent claims also encompasses various changes and modifications to the specific examples described above.

For example, in the present embodiments, a case has been described in which a first conductivity type is n-type, and a second conductivity type is p-type. However, the first conductivity type may be p-type, and the second conductivity type may be n-type.

The technical elements explained in the present specification or drawings provide technical utility either independently or through various combinations. The present invention is not limited to the combinations described at the time the claims are filed. Further, the purpose of the examples illustrated by the present specification or drawings is to satisfy multiple objectives simultaneously, and satisfying any one of those objectives gives technical utility to the present invention.

EXPLANATION OF THE NUMBERS

2: Semiconductor substrate
4, 4A, 4B: Trenches
6: Source region
8: High impurity concentration body region
10: Low impurity concentration body region
12: Body region
14: Low impurity concentration drain region (drift region)
16: High impurity concentration drain region
18: Drain region
20, 20*a*, 20*b*:. Schottky electrodes
22, 22*a*:. Insulating film surrounding gate electrodes
24, 24*a*:. Gate electrodes
26: Drain electrode
28: Interlayer insulating film
30: Source electrode
32: P-type impurity diffusion region
34: Mask
34*a*:. Opening
36: Hole
38, 40, 42, 44, 46: Insulating film (thermal oxide film)

The invention claimed is:

1. A FET incorporating a Schottky diode, comprising:
    a source region formed in a position facing a surface of a semiconductor substrate,
    a body region disposed at a deep side of the source region,
    a drain region disposed at a deep side of the body region, and
    a trench passing from the surface of the semiconductor substrate through the source region and the body region and reaching the drain region, wherein the trench extends linearly along the surface of the semiconductor substrate,
    gate electrodes and Schottky electrodes being filled alternately within the trench when viewed along the length of the trench with Schottky contacts being formed within the trench, and
    insulating film formed between each of the gate electrodes and the Schottky electrodes, the gate electrodes and the source region, the gate electrodes and the body region, and the gate electrodes and the drain region,
    wherein an insulating film is not formed between the Schottky electrodes and the drain region.

2. The FET incorporating a Schottky diode according to claim 1, wherein
    a region of an opposite conductivity type to the drain region is formed at a position facing a bottom surface of the trench.

* * * * *